United States Patent [19]
Guo et al.

[11] Patent Number: 6,017,144
[45] Date of Patent: Jan. 25, 2000

[54] METHOD AND APPARATUS FOR DEPOSITING HIGHLY ORIENTED AND REFLECTIVE CRYSTALLINE LAYERS USING A LOW TEMPERATURE SEEDING LAYER

[75] Inventors: Ted Tie Guo, Palo Alto; Mehul Bhagubhai Naik; Liang-Yu Chen, both of San Jose; Roderick Craig Mosely, Pleasanton; Israel Beinglass, Sunnyvale, all of Calif.

[73] Assignee: Applied Materials, Inc., Santa Clara, Calif.

[21] Appl. No.: 08/736,629

[22] Filed: Oct. 24, 1996

Related U.S. Application Data

[63] Continuation-in-part of application No. 08/611,108, Mar. 5, 1996.

[51] Int. Cl.$^7$ ............................. G06F 17/00; G07F 15/02
[52] U.S. Cl. ................. 364/468.28; 364/468.22; 364/468.23; 364/468.24; 364/468.26; 438/723; 438/784; 438/699; 427/99; 427/250; 427/255.11; 427/255.12
[58] Field of Search ................ 364/468.22, 468.23, 364/468.24, 468.26, 468.28, 469.02, 472.09, 472.06; 427/250, 255, 255.11, 255.12, 248.1, 99, 97, 255.1, 255.2, 255.7, 252; 437/207, 200, 238, 235, 101; 156/613, 610, 614; 438/699, 723, 784

[56] References Cited

U.S. PATENT DOCUMENTS

| | | | |
|---|---|---|---|
| 5,108,951 | 4/1992 | Chen et al. | 437/187 |
| 5,242,530 | 9/1993 | Batey et al. | 156/613 |
| 5,354,715 | 10/1994 | Wang et al. | 437/238 |
| 5,503,874 | 4/1996 | Ackerman et al. | 427/237 |
| 5,614,257 | 3/1997 | Beinglass et al. | 427/248.1 |
| 5,643,633 | 7/1997 | Telford et al. | 427/255 |
| 5,693,139 | 12/1997 | Nishizawa et al. | 117/89 |

OTHER PUBLICATIONS

U.S. Patent Application entitled, "Low Temperature Integrated Metallization Process and Apparatus"; filed Nov. 21, 1995; Serial No. 08/561,605; Inventors: Mosely, et al.; Attorney Docket No. 1088.

U.S. Patent Application entitled, "Blanket–Selective Deposition Using a Self–aligning Ultra–thin Nucleation Layer"; filed Mar. 5, 1996; Serial No. 08/611,108; Inventors: Guo, et al.; Attorney Docket No. 1269.

*Primary Examiner*—Paul P. Gordon
*Assistant Examiner*—Ramesh Patel
*Attorney, Agent, or Firm*—Thomason, Moser & Patterson

[57] ABSTRACT

The present invention is to a chemical vapor deposition process for depositing a substantially planar, highly reflective layer on a substrate, and is particularly useful for filling high aspect ratio holes in the substrate with metal-containing material. The substrate is placed in a process zone, and successive seeding and oriented crystal growth stages are performed on the substrate. In the seeding stage, the substrate is heated to temperatures $T_s$, within a first lower range of temperatures $\Delta T_s$, and a seeding gas is introduced into the process zone. The seeding gas deposits a substantially continuous, non-granular, and planar seeding layer on the substrate. Thereafter, in an oriented crystal growth stage, the substrate is maintained at deposition temperatures $T_d$, within a second higher range of temperatures $\Delta T_D$, and deposition gas is introduced into the process zone. The deposition gas forms an oriented crystal growth layer on the seeding layer, the oriented crystal growth layer having a highly reflective surface that results from highly oriented, relatively large crystals that grow on the seeding layer.

32 Claims, 11 Drawing Sheets

METHOD AND APPARATUS FOR DEPOSITING HIGHLY ORIENTED AND REFLECTIVE CRYSTALLINE LAYERS USING A LOW TEMPERATURE SEEDING LAYER

CROSS-REFERENCE

This application is a continuation-in-part of U.S. patent application Ser. No. 08/611,108, entitled "BLANKET-SELECTIVE DEPOSITION USING A SELF-ALIGNED ULTRA-THIN NUCLEATION LAYER," to Guo et al., filed on Mar. 5, 1996, which is incorporated herein by reference.

BACKGROUND

The present invention relates to an apparatus and method for depositing material on a substrate by chemical vapor deposition.

In integrated circuit fabrication, electrically conductive metal-containing material is deposited on substrates to form interconnect lines and/or filled contact holes and vias, which are used to electrically connect active devices formed on substrates. The metal-containing interconnect lines are typically formed by (i) depositing stacks of electromigration, diffusion barrier, electrical conductor, and/or antireflective layers, on the substrate, (ii) forming a patterned resist layer on the deposited layers, and (iii) etching the unprotected portions of the deposited layers to form the interconnect lines. An electrical insulator layer, such as silicon dioxide, is deposited over the interconnect lines to electrically isolate the interconnect lines. Contact holes or vias are etched through the insulator layer to expose underlying interconnect lines, or to expose semiconductor devices such as gates. The contact holes or vias are filled with additional metal-containing material to form plugs that connect the devices and interconnect lines formed on the substrate.

Conventional chemical vapor deposition (CVD) and physical vapor deposition (PVD) techniques are used to deposit electrically conductive material into the vias and contact holes formed on the substrate. One problem with conventional processes arises because the contact holes or vias (which for expedience are referred to herein as "holes") often comprise high aspect ratios, i.e., the ratio of the height of the holes to their width or diameter, of greater than 1. The aspect ratio of the holes increases as advances in technology yield more closely spaced features. Referring to FIG. 1, a substrate 10 comprises holes 11 formed within an electrically insulative or dielectric layer 12, such as for example, silicon dioxide or silicon nitride. It is difficult to deposit a uniform metal-containing layer 13 into the high aspect ratio holes 11 using chemical vapor deposition processes because the metal-containing layer 13 often preferentially deposits on the sidewalls 14 of the holes growing grains that eventually converge to form voids and discontinuities 15 within the metal-containing material 13. Thereafter, the high mobility of metal atoms, such as aluminum atoms, surrounding the voids causes the atoms to diffuse and minimize the surface area of the voids forming circular shaped voids 15, as shown in FIG. 1. These voids and discontinuities result in poor and unreliable electrical contacts.

Another problem with conventional deposition processes arises because such methods deposit crystalline grains 16 having random crystalline orientation. Highly oriented crystals can reduce electromigration of the atoms within the crystal. Electromigration is a diffusive process in which atoms diffuse from one region to another region within the deposited layer under the influence of electrical fields across the substrate, causing voids that result in "open" junctions and unreliable electrical conductivity. Conductive layers having a highly oriented crystalline structure exhibit reduced electromigration of atoms, because in certain crystallographic orientations, the conductive layers have lower diffusion coefficients. For example, deposited aluminum grains that are highly oriented in the crystallographic plane having <111> miller indices are found to exhibit excellent resistance to electromigratory diffusion. However, conventional deposition processes typically deposit more randomly oriented crystalline grains 16 on the substrate that limit the current density that a conductive plug or interconnect line can carry to typically about $10^6$ A/cm$^2$, beyond which excessive electromigration would occur.

The randomly oriented crystalline grains provided by conventional CVD and PVD processes can also result in deposition of layers having non-planar surfaces, which is undesirable for modern VLSI circuits that use multiple layers of submicron sized features to form high speed circuits. The surface 17 of the filled holes 11 in such circuits need to be planar and flat in order to accurately fabricate high density miniaturized features using conventional photolithographic processes. Conventional CVD deposition processes form a deposition layer having irregular ridges 18 on features adjacent to the holes 11 that result in an uneven and irregular surface 17, as shown in FIG. 1. The uneven deposition layers produce unfocused or blurred resist patterns in the photolithographic process, and on being etched, provide features having irregular line widths.

Conventional PVD methods, such as sputtering, also have other problems that result because material sputtered off a sputtering target by energetic plasma ions travels to the substrate 10 in a relatively straight-line path to deposit primarily on those portions of the substrate within sight of the target. The line-of-sight deposition makes it difficult to fill high aspect ratio contact holes or vias that have an aspect ratio exceeding 1. Often, less than 5% of the material deposited by conventional PVD processes is formed within the holes 11, the remaining deposits being formed on top of the features adjacent to the holes 11. In the deposition of aluminum layers, a reflow process can be used in conjunction with the PVD process, in which the substrate 10 is heated to reflow temperatures causing the deposited aluminum to flow into the bottom of the contact holes and/or vias.

However, because the PVD aluminum layer is only deposited on portions of the substrate 10, the layer must be heated to temperatures of about 400 to 550° C., in order to provide a sufficiently low viscosity aluminum layer that flows into the holes 11 in the substrate 10. Such high temperatures limit the PVD and reflow techniques to only those substrates that are not damaged by the high temperatures. For example, temperatures above 400° C. can cause diffusion of dopant material and/or decomposition of the substrate. New generations of ever miniaturized integrated circuits require low processing temperatures to obtain the required levels of miniaturization, and to allow use of low temperature materials that are often unstable at temperatures exceeding 400° C.

Thus, there is a need for a process for filling high aspect ratio holes in a substrate with metal-containing material, without forming voids or defects in the deposited material. It is also desirable for the deposition process to deposit grains that are highly oriented in particular crystallographic planes. It is further desirable for the deposition process to deposit layers having substantially planar and flat surfaces. It is also desirable for the deposition process to operate at a low temperature to reduce thermal damage to features that are sensitive to high temperatures.

SUMMARY

The present invention is to a chemical vapor deposition process for depositing a substantially planar, highly reflective, layer on a substrate, and is particularly useful for filling high aspect ratio holes in the substrate. The substrate is placed in a process zone, and successive seeding and oriented crystal growth deposition stages are performed on the substrate. In the seeding stage, the substrate is heated to temperatures $T_s$ within a first lower range of temperatures $\Delta T_s$, and seeding gas is introduced into the process zone. The seeding gas deposits a substantially continuous, non-granular, seeding layer on the substrate. Thereafter, in a subsequent oriented crystal growth stage, the substrate is maintained at deposition temperatures $T_d$ within a second higher range of temperatures $\Delta T_D$, and deposition gas is introduced into the process zone. The deposition gas forms an oriented crystal growth layer on the seeding layer, the oriented crystal growth layer having a highly reflective surface that results from highly oriented, large crystals that grow on the seeding layer.

The process is useful for forming a substrate comprising a substantially planar, highly reflective, aluminum-containing layer that has <111> miller indices crystallographic planes that exhibit an x-ray diffraction peak with a full width at half maximum of less than about 3° θ. The reflectivity of the substrate is at least 190% as compared to the 100% reflectivity of a monocrystalline silicon wafer. The highly reflective and planar surface of the substrate allows accurate and reproducible formation of highly miniaturized circuits on the substrate.

Another aspect of the present invention comprises a computer program product for operating a process chamber for depositing a substantially planar, highly reflective, layer on the substrate. The computer product comprises a computer usable medium having computer readable program code means embodied therein. The computer program code means comprises:

(a) substrate positioning code for positioning the substrate in the process chamber;

(b) heater control code for operating a heater in (i) a seeding stage, wherein the substrate is maintained at temperatures $T_s$ within a first lower range of temperatures $\Delta T_s$, and (ii) an oriented crystal growth stage, wherein the substrate is maintained at deposition temperatures $T_d$ within a second higher range of temperatures $\Delta T_D$; and (c) process gas control code for (i) in a seeding mode, introducing seeding gas into the process zone during the seeding stage to deposit a substantially continuous seeding layer on the substrate, and (ii) in a deposition mode, introducing deposition gas into the process zone during the oriented crystal growth stage to grow an oriented crystal growth layer on the seeding layer, the oriented crystal growth layer comprising large crystals substantially oriented to one another, and having a substantially planar and highly reflective surface.

In yet another aspect, the present invention comprises a computer readable program product for operating a process chamber that comprises positioning program code means for positioning the substrate in the process chamber. Seeding program code means are provided for (i) heating the substrate to temperatures $T_s$ within a range of temperatures $\Delta T_s$, and (ii) introducing a seeding gas into the process zone to deposit a substantially continuous seeding layer on portions of the substrate. Oriented crystal growth program code means for are used to (i) maintain the substrate at a deposition temperatures $T_d$ within a range of temperatures $\Delta T_D$, and (ii) introduce deposition gas into the process zone to form an oriented crystal growth layer that is grown on the seeding layer to form a substantially planar, highly reflective layer on the substrate.

DRAWINGS

The file of this patent includes at least one drawing executed in color. Copies of this patent with color drawings will be provided by the Patent and Trademark Office upon request and payment of the necessary fee.

These and other features, aspects, and advantages of the present invention will become better understood with reference to the following description, appended claims, and accompanying drawings, which illustrate examples of the present invention, where:

Figure 9:
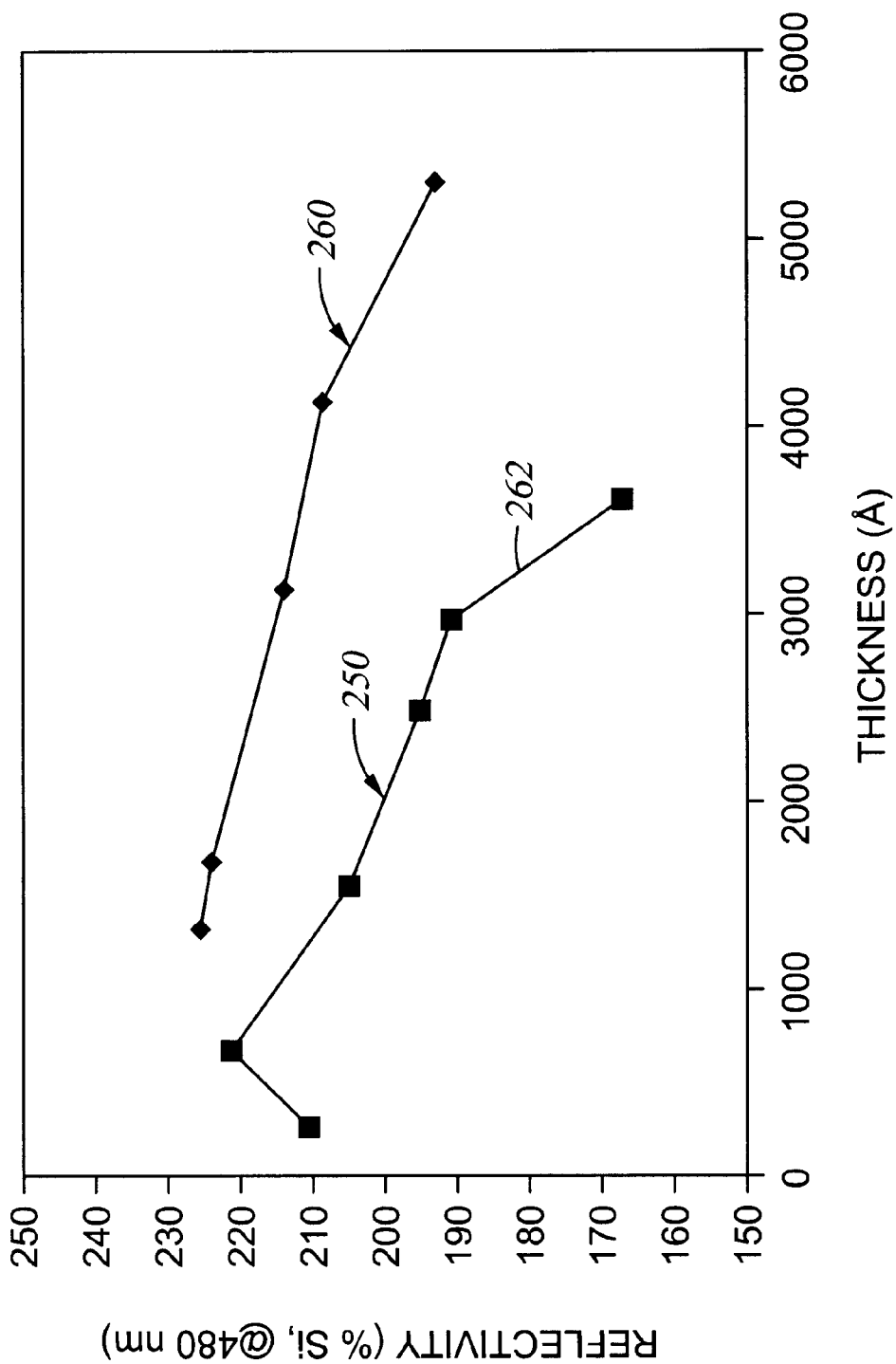
Figure 10A:
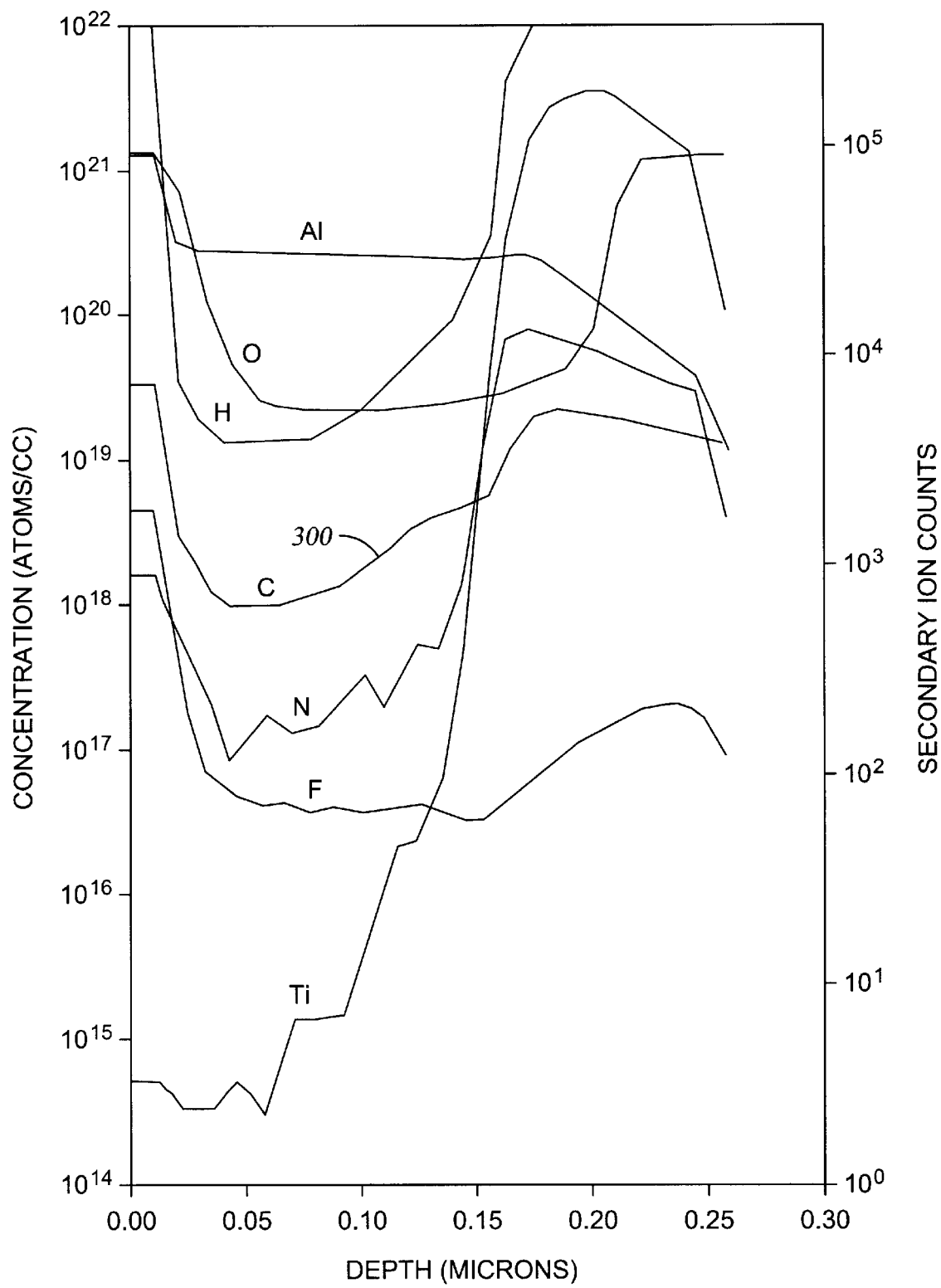
Figure 10B:
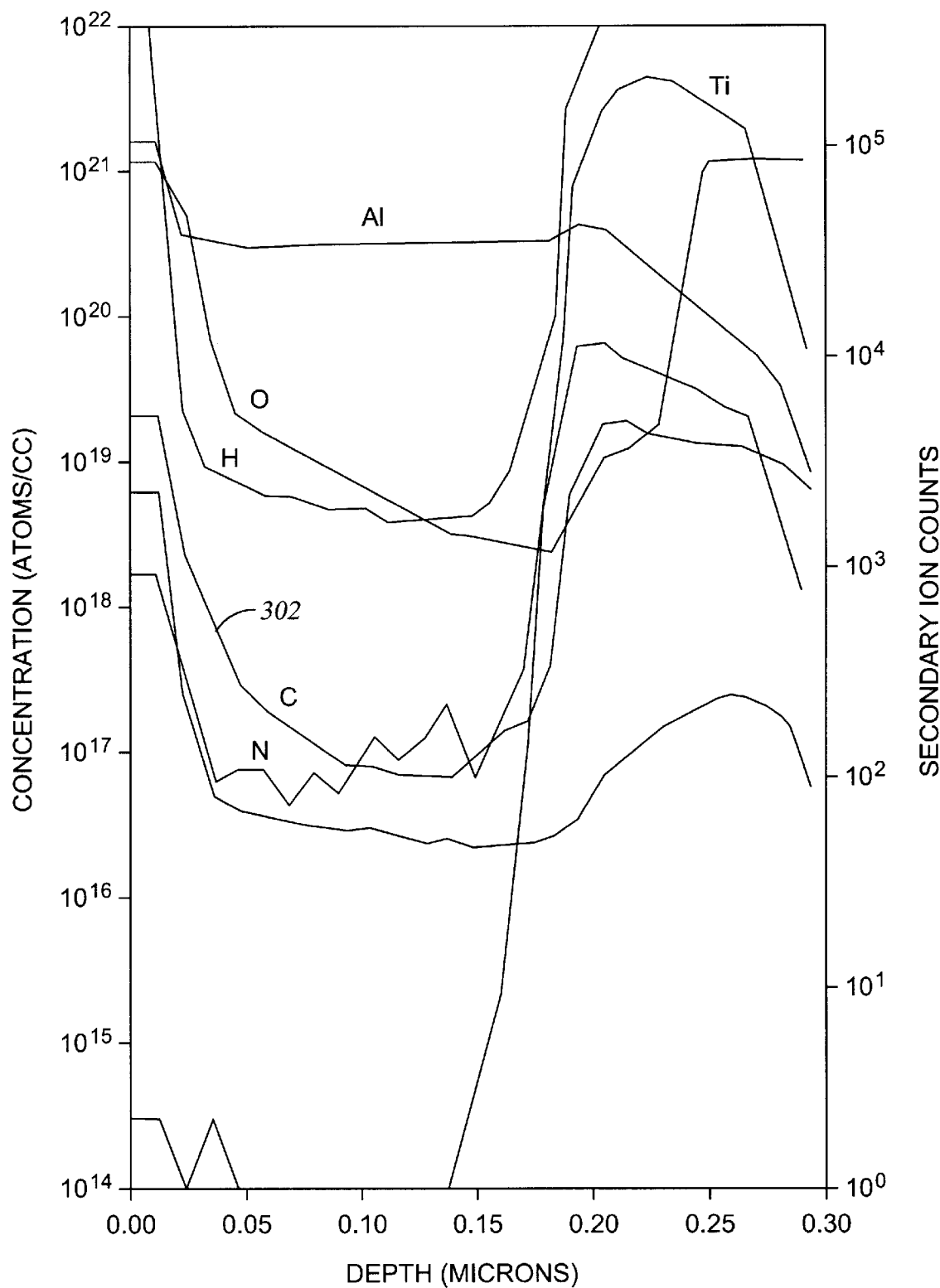

FIG. 9 is a graph showing a comparison of the surface reflectivity f various thickness of (i) a conventional layer deposited on the substrate, and (ii) a seeding and oriented crystal growth layer formed by the present invention; and FIG. 10a and 10b are graphs of secondary ion mass spectroscopic analysis showing the aluminum and carbon content in the surface of (i) a conventional aluminum layer, and (ii) an aluminum layer deposited by the present process, respectively.

DESCRIPTION

Figure 1:
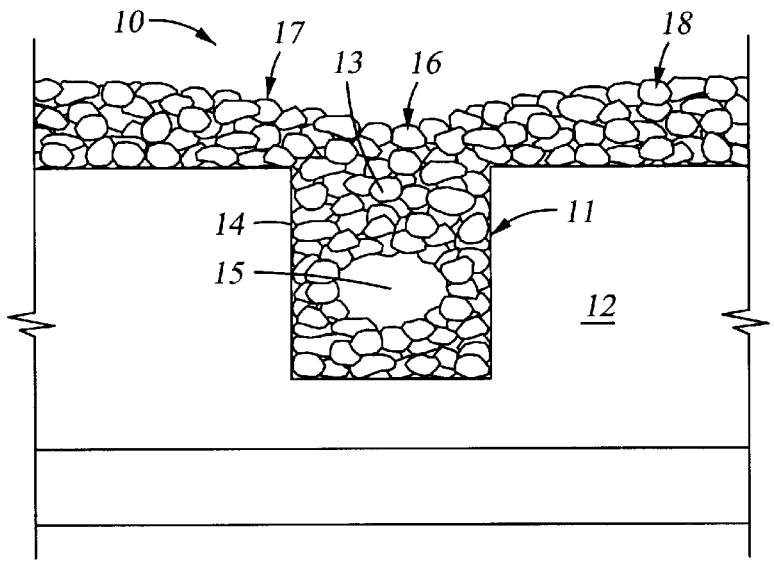
FIGS. 1 is a schematic illustration of a partial cross-sectional view of a prior art substrate showing a randomly-oriented, fine-grained, granular, deposition layer in the etched holes in the substrate, with voids and discontinuities, and a non-planar surface.
Figure 2A:
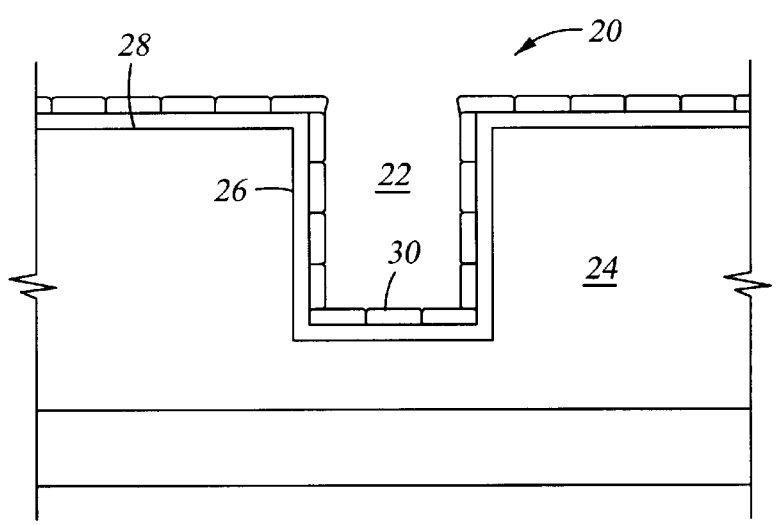
FIGS. 2a is a schematic illustration of a partial cross-sectional view of a substrate processed according to the present invention showing a substantially continuous seeding layer deposited on the substrate.
Figure 2B:
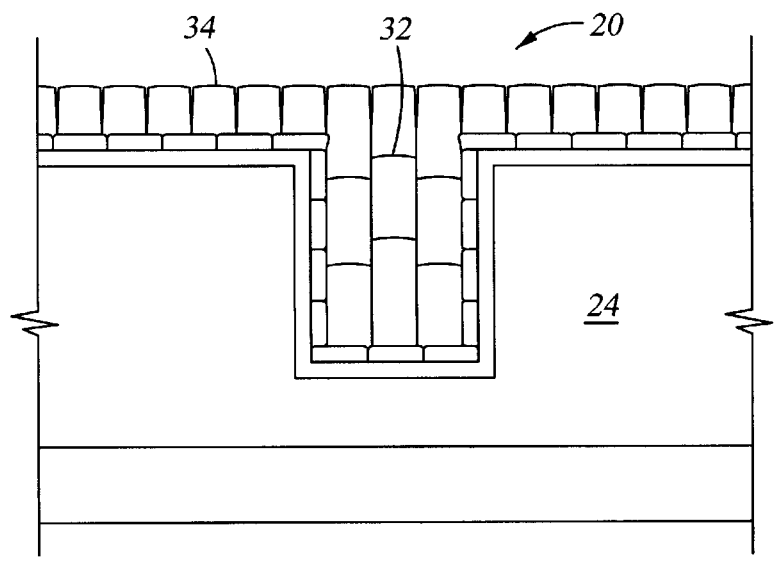
FIG. 2b is a schematic illustration of the substrate of FIG. 2a, showing a substantially planar, highly oriented crystal growth layer formed on the seeding layer.

The present invention is directed to an apparatus and method for depositing a highly crystallographically oriented, substantially planar, layer of material on a substrate 20, as shown in FIGS. 2a–2b, by a chemical vapor deposition (CVD) process. The substrate 20 can include glass, polymer, metal, and semiconductor substrates, including for example, monocrystalline silicon, gallium arsenide, or polysilicon substrates. The method is particularly suitable for depositing a layer of highly oriented crystals of electrically conductive material into holes 22 etched through insulative layers 24 (such as silicon oxide, phosphosilicate glass (PSG), or borophosphosilicate glass (BPSG) layers). The insulator layer 24 is typically deposited to a thickness of about 3000 to 15,000 Å, using a conventional chemical vapor deposition processes for depositing insulator layers on a substrate are (i) silicon source gas for example $SiH_4$ or $SiCl_2H_2$, and oxygen source gas such as $CO_2$ and $H_2$, or $N_2O$; (ii) a single gas containing both silicon and oxygen such as $Si(OC_2H_5)_4$, or (iii) gases such as $SiH_4$, and $NH_3$ or $N_2$, for depositing $Si_3N_4$. Thereafter, holes 22 having diameters of 0.25 to 1 μm, and heights ranging from about 0.3 μm to about 10 μm, and more typically from about 0.3 to 1.2 μm, are etched in the insulator layer 24, as illustrated in FIG. 2a, by conventional reactive ion etching methods that use halogen-containing gases. The spacings between the holes 22 is typically at least about 0.15 μm, and more typically at least about 0.5 μm. Some of the holes 22 have corners and edges 26 and have high aspect ratios of at least about 1, and more typically about 2.

The material deposited on the substrate 20 is typically a metal-containing material, such as an aluminum-containing material, for example alloys of aluminum, copper, and optionally silicon. Typically, the aluminum alloys contain 95 to 98 wt % aluminum, 0 to 3 wt % silicon, and 0.5 to 1 wt % copper. Copper is added to prevent electromigration of aluminum atoms to extend the lifetime of the conductive features, and silicon is added to reduce inter-diffusion of atoms between the aluminum layer and the underlying silicon substrate. Each component of the aluminum alloy can be deposited in separate processing steps, or the multi-component alloy can be deposited in a single process step. Instead of a metal-containing material, the present invention can also be used to deposit other materials, such as oxides, nitrides, and silicides, including or example polysilicon, silicon oxide, and silicon nitride.

With reference to FIGS. 2a and 2b, the metal-containing material is deposited over a nucleation sublayer 28, typically comprising a titanium-containing layer having a thickness of 50 to 500 Å, that serves to enhance nucleation of deposited metal-containing layers. In the present process, material is deposited on the substrate 20 to uniformly fill the high aspect ratio holes 22 without forming voids in the holes, using a multistage process, comprising an initial seeding stage and at least one subsequent oriented crystal growth deposition stage. The initial seeding stage is used to deposit a substantially continuous, non-granular, and planar seeding layer 30 on the substrate 20. The seeding layer 30 uniformly wets the substrate to provide a substantially continuous and non-granular layer at low thicknesses, i.e., less than about 300 Å, which is particularly desirable to provide uniform deposition in small contact holes and vias in the substrate. In a subsequent oriented crystal growth stage, a highly oriented and epitaxially grown layer 32 comprising relatively large crystals substantially oriented to one another, and having a substantially planar and highly reflective surface 34, is grown on the continuous and thin seeding layer 30. The oriented crystal grown layer 30 can be used to completely fill the hole. Alternatively, the CVD process can partially fill the hole, followed by a relatively low temperature PVD deposition process, to completely fill the hole.

Figure 3A:
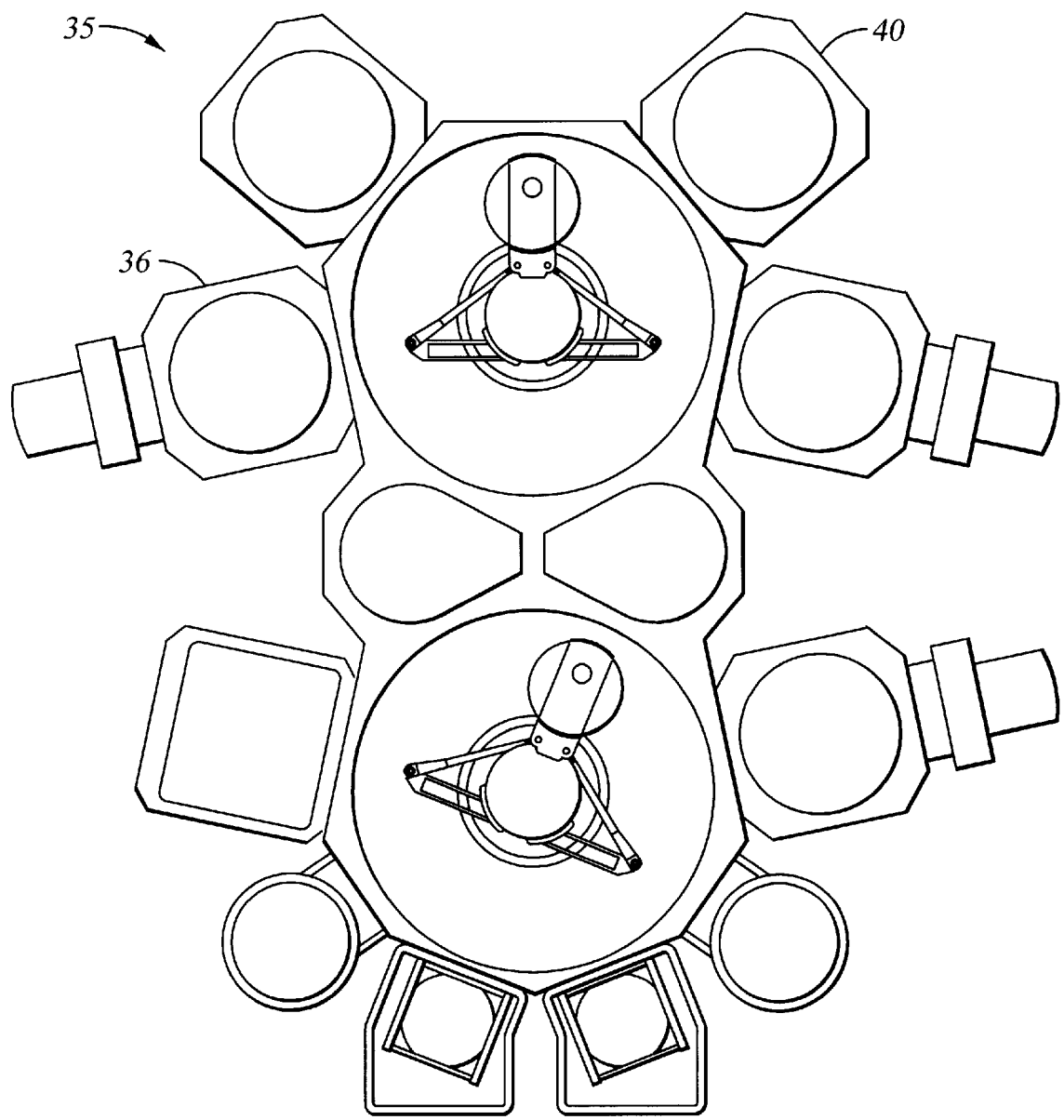
FIG. 3a is a schematic partial sectional view of an integrated multichamber apparatus suitable for performing CVD and PVD processes on the substrate.
Figure 3B:
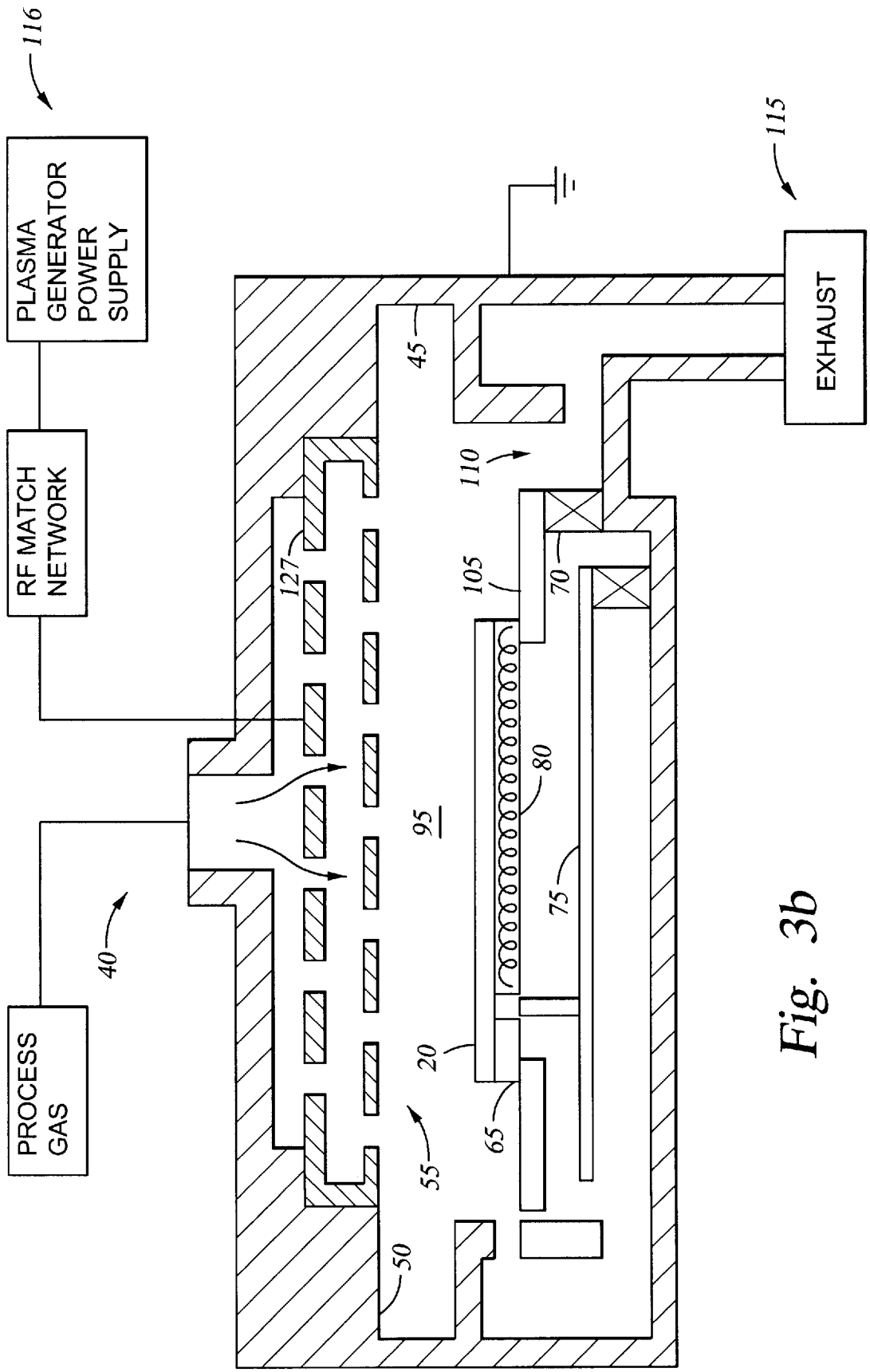
FIG. 3b is a partial sectional schematic view of a CVD deposition chamber suitable for performing the CVD deposition process of the present invention.

A schematic of a multichamber processing apparatus 35 suitable for performing the CVD process of the present invention, is illustrated in FIG. 3a. The apparatus is an "ENDURA" system commercially available from Applied Materials, Santa Clara, Calif. The particular embodiment of the apparatus 35 shown herein, is suitable for processing planar substrates 20, such as semiconductor substrates, is provided only to illustrate the invention, and should not be used to limit the scope of the invention. The apparatus 35 typically comprises a cluster of interconnected process chambers, for example, CVD and PVD deposition, and rapid thermal annealing chambers.

The apparatus 35 includes at least one enclosed PVD deposition chamber 36 for performing PVD processes, such as sputtering. The PVD chamber 36 comprises a sputtering target (not shown) of sputtering material facing the substrate 20. The target is electrically isolated from the chamber and serves as a process electrode for generating a sputtering plasma. During the sputtering process, a sputtering gas, such as argon or xenon, is introduced into the chamber 36. An RF bias current is applied to the sputtering target, and the support supporting the substrate in the chamber is electrically grounded. The resultant electric field in the chamber 36 ionizes sputtering gas to form a sputtering plasma that sputters the target causing deposition of material on the substrate. In sputtering processes, the plasma is typically generated by applying a DC or RF voltage at a power level of from about 100 to about 20,000 Watts, and more typically from 100 to 10,000 Watts, to the sputtering target.

The apparatus also comprises a CVD deposition chamber 40 having surrounding sidewalls 45 and a ceiling 50. The chamber 40 comprises a process gas distributor 55 for distributing process gas. Mass flow controllers and air operated valves are used to control the flow of process gas into the deposition chamber 40. The gas distributor 55 is typically mounted above the substrate (as shown), or peripherally about the substrate 20 (not shown). A support 65 is provided for supporting the substrate in the deposition chamber 40. The substrate 20 is introduced into the chamber 40 through a substrate loading inlet in the sidewall 45 of the chamber 40 and placed on the support 65. The support 65 can be lifted or lowered by support lift bellows 70 so that the gap between the substrate 20 and gas distributor 55 can be adjusted. A lift finger assembly 75 comprising lift fingers that are inserted through holes in the support 65 can be used to lift and lower the substrate 20 onto the support to facilitate transport of the substrate 20 into and out of the chamber 40. A thermal heater 80 is provided in the chamber to rapidly heat the substrate 20. Rapid heating and cooling of the substrate is preferred to increase processing throughput, and to allow rapid cycling between successive processes operated at different temperatures within the same chamber 65. The temperature of the substrate 20 is generally estimated from the temperature of the support 65 that is measured using a substrate 20.

The substrate 20 is processed in a process zone 95 above a horizontal perforated barrier plate 105. The barrier plate 105 has exhaust holes 110 which are in fluid communication with an exhaust system 115 for exhausting spent process gas from the chamber 40. A typical exhaust system 115 comprises a rotary vane vacuum pump (not shown) capable of achieving a minimum vacuum of about 10 mTorr, and optionally a scrubber system for scrubbing byproduct gases. The pressure in the chamber 40 is sensed at the side of the substrate 20 and is controlled by adjusting a throttle valve in the exhaust system 115.

A plasma generator 116 is provided for generating a plasma in the process zone 95 of the chamber 40 for plasma enhanced chemical vapor deposition processes. The plasma generator 116 can generate a plasma (i) inductively by applying an RF current to an inductor coil encircling the deposition chamber (not shown), (ii) capacitively by applying an RF current to process electrodes in the chamber, or (iii) both inductively and capacitively. A DC or RF current at a power level of from about 750 Watts to about 2000 Watts can be applied to an inductor coil (not shown) to inductively couple energy into the deposition chamber to generate a plasma in the process zone 95. When an RF current is used, the frequency of the RF current is typically from about 400 Khz to about 16 Mhz, and more typically about 13.56 Mhz. Optionally, a gas containment or plasma focus ring (not shown), typically made of aluminum oxide or quartz, can be used to contain the flow of process gas or plasma around the substrate 20.

The process can be implemented using a computer program product 141 that runs on a conventional computer system comprising a central processor unit (CPU) interconnected to a memory system with peripheral control components, such as for example a 68400 microprocessor, commercially available from Synenergy Microsystems, California. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 4:
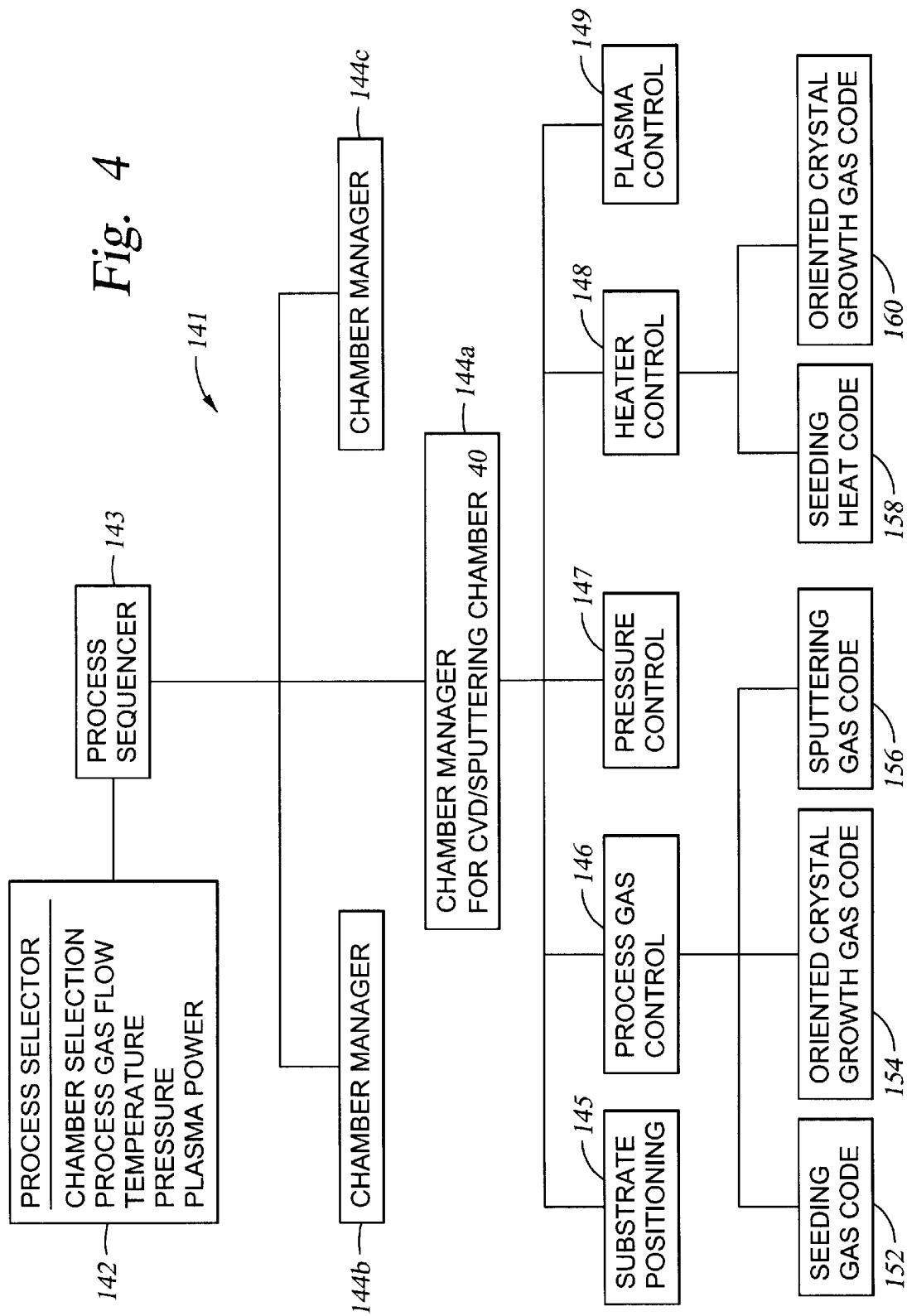
FIG. 4 is a simplified block diagram showing the hierarchical control structure of a computer program of the present invention.

FIG. 4 shows an illustrative block diagram of the hierarchical control structure of the computer program 141. A user enters a process set and process chamber number into a process selector subroutine 142. The process sets are predetermined sets of process parameters necessary to carry out specified processes in a specific process chamber, and are identified by predefined set numbers. The process set the desired process chamber, and (ii) the desired set of process parameters needed to operate the process chamber for performing the a particular process. The process parameters relate to process conditions such as, for example, process gas composition and flow rates, temperature, pressure, plasma conditions such as RF bias power levels and magnetic field power levels, cooling gas pressure, and chamber wall temperature.

A process sequencer subroutine 143 comprises program code for accepting the identified process chamber and set of process parameters from the process selector subroutine 142, and for controlling operation of the various process chambers. Multiple users can enter process set numbers and process chamber numbers, or a user can enter multiple process set numbers and process chamber numbers, so the sequencer subroutine 143 operates to schedule the selected processes in the desired sequence. Preferably the sequencer subroutine 143 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 143 can be designed to take into consideration the present condition of the process chamber being used in comparison with the desired process conditions for a selected process, or the "age" of each particular user entered request, or any other relevant factor a system programmer desires to include for determining scheduling priorities.

Once the sequencer subroutine 143 determines which process chamber and process set combination is going to be executed next, the sequencer subroutine 143 causes execution of the process set by passing the particular process set parameters to chamber manager subroutines 144a–c which control multiple processing tasks in different process chambers according to the process set determined by the sequencer subroutine 143.

For example, the chamber manager subroutine 144a comprises program code for controlling CVD process operations, within the described process chamber 40. The chamber manager subroutine 144 also controls execution of various chamber component subroutines or program code modules, which control operation of the chamber components necessary to carry out the selected process set. Examples of chamber component subroutines are substrate positioning subroutine 145, process gas control subroutine 146, pressure control subroutine 147, heater control subroutine 148, and plasma control subroutine 149. These different subroutines function as seeding program code means for (i) heating the substrate 20 to temperatures $T_s$ within a range of temperatures $\Delta T_s$, and (ii) introducing a seeding gas into the process zone to deposit a substantially continuous seeding layer on portions of the substrate; and deposition growth program code means for (i) maintaining the substrate 20 at a deposition temperatures $T_d$ within a range of temperatures $\Delta T_D$, and (ii) introducing deposition gas into the process zone to form an oriented crystal growth layer that is grown on the seeding layer. Those having ordinary skill in the art would readily recognize that other chamber control subroutines can be included depending on what processes are desired to be performed in the process chamber 40.

In operation, the chamber manager subroutine 144a selectively schedules or calls the process component subroutines in accordance with the particular process set being executed. The chamber manager subroutine 144a schedules the process component subroutines similarly to how the sequencer subroutine 143 schedules which process chamber 40 and process set is to be executed next. Typically, the chamber manager subroutine 144a includes steps of monitoring the various chamber components, determining which components needs to be operated based on the process parameters for the process set to be executed, and causing execution of a chamber component subroutine responsive to the monitoring and determining steps. Operation of particular chamber component subroutines will now be described. The substrate positioning code or subroutine 145 comprises program code for controlling chamber components that are used to load the substrate 20 onto the chamber support 65, and optionally to lift the substrate to a desired height in the chamber 40 to control the spacing between the substrate and the gas distributor 55. When a substrate 20 is loaded into the process chamber 40, the substrate support 65 is lowered to receive the substrate, and thereafter, the support is raised to the desired height in the chamber. The substrate positioning subroutine 145 controls movement of the support 65 in response to process set parameters related to the support height that are transferred from the chamber manager subroutine 144*a*.

The process gas control subroutine 146 has program code for controlling process gas composition and flow rates. Generally, the process gases supply lines for each of the process gases, include (i) safety shut-off valves (not shown) that can be used to automatically or manually shut off the flow of process gas into the chamber, and (ii) mass flow controllers (also not shown) that measure the flow of a particular gas through the gas supply lines. When toxic gases are used in the process, the several safety shut-off valves are positioned on each gas supply line in conventional configurations. The process gas control subroutine 146 controls the open/close position of the safety shut-off valves, and also ramps up/down the mass flow controllers to obtain the desired gas flow rate. The process gas control subroutine 146 is invoked by the chamber manager subroutine 144*a*, as are all chamber component subroutines, and receives from the chamber manager subroutine process parameters related to the desired gas flow rates. Typically, the process gas control subroutine 146 operates by opening the gas supply lines, and repeatedly (i) reading the necessary mass flow controllers, (ii) comparing the readings to the desired flow rates received from the chamber manager subroutine 144*a*, and (iii) adjusting the flow rates of the gas supply lines as necessary. Furthermore, the process gas control subroutine 146 includes steps for monitoring the gas flow rates for unsafe rates, and activating the safety shut-off valves when an unsafe condition is detected.

The process gas control subroutine 146 comprises program code for operating the chamber in a seeding mode or an oriented crystal growth mode. In the seeding stage, the seeding gas program code 152 flows seeding gas into the chamber 40 for an amount of time necessary to form a seeding layer on the substrate 20. Thereafter, in the deposition growth stage, the deposition gas program code 154 flows deposition gas into the chamber 40 for an amount of time necessary to grow the desired thickness of the oriented crystal growth layer on the seeding layer. Sputtering gas program code 156 can also be provided to introduce sputtering gas into the PVD chamber 36 during performance of the PVD process step.

The process gas can be formed from a gas or liquid precursor. When a process gas is vaporized from a liquid precursor, for example dimethyl aluminum hydride (DMAH), the process gas control subroutine 146 is written to include steps for bubbling a carrier gas such as hydrogen, argon, or helium, through the liquid precursor in a bubbler assembly. For this type of process, the process gas control subroutine 146 regulates the flow of the carrier gas, the pressure in the bubbler, and the bubbler temperature in order to obtain the desired process gas flow rates. As discussed above, the desired process gas flow rates are transferred to the process gas control subroutine 146 as process parameters. Furthermore, the process gas control subroutine 146 includes steps for obtaining the necessary carrier gas flow rate, bubbler pressure, and bubbler temperature for the desired process gas flow rate by accessing a stored table containing the necessary values for a given process gas flow rate. Once the necessary values are obtained, the carrier gas flow rate, bubbler pressure and bubbler temperature are monitored, compared to the necessary values, and adjusted pressure in the chamber 40 by regulating the size of the opening of the throttle valve in the exhaust system 115 of the chamber. The opening size of the throttle valve is set to control the chamber pressure to the desired level in relation to the total process gas flow, size of the process chamber, and pumping setpoint pressure for the exhaust system 115.

When the pressure control subroutine 147 is invoked, the desired or target pressure level is received as a parameter from the chamber manager subroutine 144*a*. The pressure control subroutine 147 operates to measure the pressure in the chamber 40 by reading one or more conventional pressure nanometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 147 can be written to open or close the throttle valve to a particular opening size to regulate the chamber 40 to the desired pressure.

The heater control subroutine 148 comprises program code for controlling the temperature of the heater 80 used to heat the substrate 20. The heater control subroutine 148 includes seeding stage heating program code 158 for operating in a seeding stage in which the substrate is maintained at the desired seeding temperatures $T_s$ within the range of temperatures $\Delta T_s$. Typically, the subroutine 148 is programmed to ramp up the temperature of the support from ambient chamber temperatures to a set point temperature. When the substrate reaches the seeding temperatures $T_s$, the process gas control subroutine 146 is programmed to introduce seeding gas into the chamber, as described above. The heater control subroutine 148 also comprises an oriented crystal growth or epitaxial growth heating program code 160 for rapidly heating the substrate to deposition temperatures $T_d$ within a range of temperatures $\Delta T_D$ that are suitable for growing an oriented crystal growth layer on the seeding layer. In this step, the heater control subroutine 148 is invoked by the chamber manager subroutine 144*a*. and receives a ramp rate temperature parameter of at least about 50° C./min.

The heater control subroutine 148 measures temperature by measuring voltage output of a thermocouple located in the support, compares the measured temperature to the setpoint temperature, and increases or decreases current applied to the heater 80 to obtain the desired ramp rate or setpoint temperature. The temperature is obtained from the measured voltage by looking up the corresponding temperature in a stored conversion table, or by calculating the temperature using a fourth order polynomial. When radiant lamps are used as the heater 80, the heater control subroutine 148 gradually controls a ramp up/down of current applied to the lamp that increases the life and reliability of the lamp. Additionally, a built-in fail-safe mode can be included to detect process safety compliance, and to shut down operation of the heater 80 if the process chamber 40 is not properly set up.

The plasma control subroutine 149 comprises program code for forming a deposition plasma in the chamber during operation of the chamber in a chemical vapor deposition mode. The subroutine 149 sets the RF bias voltage power level applied to the process electrodes 60, 65 in the chamber 40, and optionally sets the level of the magnetic field generated in the chamber, to form the deposition plasma. Similar to the previously described chamber component subroutines, the plasma control subroutine 149 is invoked by the chamber manager subroutine 144a. In operation, the plasma condition 149 includes steps for reading both "forward" power applied to the plasma generator 116, and "reflected" power flowing through the chamber 40. An excessively high reflected power reading indicates that the plasma has not been ignited, and the plasma control subroutine 149 restarts or shuts down the process. The read power levels are compared against target levels, and the current is adjusted to control the plasm for applying a sinusoidal wave current to the generator to form a rotating magnetic field in the chamber 40. The sinusoidal wave needed to generate a desired magnetic field can be obtained from a stored table of sinusoidal values corresponding to magnetic field strengths, or calculated using a sinusoidal equation.

A multistage process including at least first and second successive stages can be performed in different chambers, to uniformly fill the high aspect ratio holes 22 without forming voids in the holes. The multistage process of the present invention is illustrated by way of an exemplary process that is performed in separate CVD and PVD chambers, however, it should be understood that the process can be performed in a single deposition chamber capable of performing CVD and PVD processes. Thus, the scope of the present invention should not be limited to the chambers described herein. The multistage process generally comprises an initial seeding stage, and a subsequent oriented crystal growth stage. In the initial seeding stage, seeding gas is introduced into the process zone, and the process zone is maintained at process conditions suitable for depositing a substantially continuous, non-granular, and planar seeding layer 30 on the substrate. In at least one successive oriented crystal growth stage, deposition gas is introduced into the process zone and the process zone is maintained at process conditions suitable for depositing an oriented crystal growth layer 32 comprising large crystals substantially oriented to one another, with a substantially planar, highly reflective surface 34. The seeding gas and the deposition gas, can comprises different gases or can comprises the same precursor gas.

Preferably, a thin nucleation sublayer 28 is deposited on the substrate prior to performance of the present process. The thin sublayer provides active sites that enhance deposition of the seeding layer 30 on the substrate, and serves as a diffusion barrier that reduces diffusion of silicon from underlying layers into the deposition layers. Suitable nucleation sublayers 28 include titanium-containing materials, such as for example, titanium, titanium nitride, and combinations thereof. The sublayer 28 can be deposited by chemical vapor deposition, or by physical vapor deposition processes, such as sputtering or evaporation, using conventional methods.

Preferably, the sublayer 28 is deposited to a thickness of about 50 to 1000 Å, and most preferably comprises a combination of PVD deposited titanium and CVD or PVD deposited titanium nitride as described in aforementioned commonly assigned patent application to Guo et al. For example, the sublayer can comprise 50 Å of TiN deposited over 200 to 400 Å of titanium.

In the first seeding stage of the present process, a thin, substantially continuous seeding layer 30 is deposited on the sublayer 28 by introducing a short burst of seeding gas into the chamber, while the substrate is still at relative low temperatures $T_s$, in a first lower range of temperatures $\Delta T_s$. Without being bound by theory, it is believed that the seeding gas deposits a thin seeding layer at the low temperatures that passivates the titanium-containing sublayer, thereby reducing adsorption or deposition of carbon and/or oxygen-containing species on the surface of the substrate when the substrate is heated to the subsequent higher temperatures used to grow a deposition layer on the seeding layer 30. Furthermore, the thin seeding layer 30 "wets" the substrate better than conventional films to form a substantially continuous, non-granular layer comprising crystal grains having $\Theta$ wetting angles of less than 40°, and more typically less than 30°. The uniformly wetting seeding layer 30 provides a substantially continuous surface coverage of the substrate 20 at low thicknesses of less than 300 Å. In contrast, conventional deposition processes deposit crystal grains having wetting angles of greater than 70°, and more typically greater than 90°, that do not continuously cover the substrate until thickness exceeding 400–500 Å or even higher. It is believed that the more granular conventional deposition layers occur because of the presence of carbon atoms on the surface of the substrate that act as active sites which promote deposition of a granular layer. Also, in prior art processes, the relatively high carbon and/or oxygen concentration on the substrate surface increases the surface tension forces at the interface of the deposited grains, substrate, and vapor phase in the chamber, causing deposited material to form separate granular island structures having a high wetting angle. In contrast, the present seeding stage performed at low temperatures before carbon species are absorbed on the substrate 20, provides a more uniformly wetting, continuous planar film structure that is substantially absent granular island-type crystals. The substantially continuous seeding layer 30 allows growth of an oriented crystal growth layer 32 having large, highly oriented grains that exhibit improved planarity and reflectivity.

In the seeding stage, seeding gas is introduced into the deposition chamber 40 via the gas distributor 55 while the substrate 20 is maintained at nucleation temperatures $T_s$, that are typically about 10 to 30° C. lower than optimal deposition temperatures $T_d$. For the deposition of aluminum from aluminum precursor seeding gases, preferably, the range of temperatures $\Delta T_s$ is from about 200° C. to about 300° C., and more typically of about 220° C. to 250° C. Preferably, the seeding gas is introduced into the chamber when the substrate is at temperatures less than 300° C., and more preferably less than 250° C. When a substrate 20 is transferred to the chamber, initially, the substrate is supported by lift pins extending out of the support 65. The lift pins are withdrawn into the support to lower the substrate onto the support. It is preferred to introduce the seeding gas as soon as the substrate 20 rests on the support, before the temperature of the substrate equilibriates to the temperature of the support and while the substrate is still ramping up in temperature. This allow the substrate 20 to be exposed to the seeding gas while it is being heated from its initial ambient temperature to the temperature of the support 65 (which is in the range of preferred nucleation temperatures $\Delta T_s$) without performing a separate heatup or cool-down step. This synergistic approach provides faster substrate processing throughput.

When the substrate is at temperatures $T_s$, seeding gas is introduced into the deposition chamber 40 via the gas distributor 55. The seeding gas decomposes on contact with the nucleation sublayer 28 on the substrate to deposit a substantially continuous seeding layer on the substrate. Suitable seeding gases for depositing an aluminum-containing seeding layer include aluminum alkyls and aluminum alkyl halides, such as for example, dimethyl aluminum hydride (DMAH), tri-isobutyl aluminum, trimethylamine alane, dimethylethylamine alane, and intermolecular compounds between triethyl aluminum and dimethyl aluminum hydride. For example, dimethyl aluminum hydride, which is a preferred seeding gas, reacts with hydrogen in the reaction:

$$(CH_3)_2AlH + H_2 \rightarrow Al + CH_4 + H_2$$

For the deposition of aluminum using DMAH, optimal deposition temperatures are typically about 260° C., and a preferred range of temperatures $\Delta T_s$ is from about 180 to about 300° C. The flow rate of the seeding gas is selected to provide a deposition rate of at least 20 Å/sec, and more preferably from about 40 to about 100 Å/sec. The seeding gas flow rates range from about 100 to about 1000 sccm for the size of the deposition chamber 40 described herein. For example, DMAH is vaporized from a liquid precursor by bubbling a carrier gas, such as for example, hydrogen, argon, or helium, through the liquid precursor in a bubbler assembly. Thus, the flow of DMAH is regulated by controlling the flow of carrier gas, the pressure in the bubbler, and the bubbler temperature in order to obtain the desired process gas flow rates. During the seeding stage, the process zone 95 is maintained at a pressure of at least 0.5 Torr, and more preferably from about 1 Torr to about 30 Torr. The nucleation process is performed for a sufficient time to form a continuous, non-granular, and planar seeding layer 30 in the holes 22, typically, for about 2 to about 60 seconds.

Thereafter, in the oriented crystal growth stage, the substrate 20 is heated to average deposition temperatures $T_d$ that are higher than the average nucleation temperatures $T_s$ by about 10 to 30° C. For example, for aluminum-containing precursor gases, preferably, the temperatures $T_d$ are within a range of second higher temperatures $\Delta T_D$ of from about 200° C. to 420° C., and more typically from about 240° C. to about 340° C. When the substrate reaches the desired temperatures $T_d$, deposition gas is introduced into the deposition chamber. The deposition gas decomposes on contact with the seeding layer 30 to epitaxially grow a highly crystallographically oriented layer 32 on the seeding layer. The oriented crystal growth layer 32 comprises crystals that are oriented substantially planar and highly reflective surface. By "oriented crystal growth" or "epitaxially grown" it is meant that the crystals within the oriented layer 32 have crystallographic planes that are substantially aligned to one another, and preferably, also aligned to the crystallographic planes of the seeding layer 30 formed on the substrate 20. This provides relatively large and highly oriented crystals within the oriented crystal growth layer 32 that have a planar and highly reflective surface. The large average diameter of the oriented crystal grown grains is typically from about 1000 to about 8000 Å, and more typically from about 4000 to about 7000 Å.

Suitable deposition gases for depositing aluminum include aluminum alkyls and aluminum alkyl halides. Suitable deposition gases include for example, dimethyl aluminum hydride (DMAH), tri-isobutyl aluminum, trimethylamine alane, dimethylethylamine alane (DMMA), and intermolecular compounds between triethyl aluminum and dimethyl aluminum hydride; of which dimethyl aluminum hydride is preferred. The flow rate of the deposition gas is selected to provide a deposition rate of at least 20 Å/sec, and more preferably at least about 60 Å/sec. For aluminum deposition using DMAH suitable deposition gas flow rates range from about 100 to about 1000 sccm for the size of the deposition chamber 40 described herein. During the deposition process, the process zone 95 is maintained at a pressure of at least 0.5 Torr, and more preferably from about 1 Torr to about 30 Torr.

To form a planar, highly reflective layer 32 on the substrate, the thickness of the seeding layer 30 should be controlled to form a substantially continuous layer that uniformly covers a surface of the substrate. Preferably, the seeding and oriented crystal growth stages are each performed at thicknesses of less than 300 Å for sufficient time that the ratio of the thickness of the seeding layer 30 to the thickness of the oriented crystal growth layer 32 is from about 1:10 to about 1:3000. Typically, the seeding layer 30 is deposited to a thickness of 10 to 500 Å, and the oriented crystal growth layer is grown on the seeding layer to a thickness of about 200 to about 6000 Å, and more typically from about 500 to about 3000 Å.

Thereafter, the substrate is transferred to the PVD chamber 36, and a CVD or PVD process stage is performed to fill the hole 22 in the substrate 20 substantially without forming voids in the filled material. Preferably, a PVD sputtering process is performed to form a sputtered layer (not shown) on the oriented crystal growth layer 32 using a sputtering process gas, such as for example (i) a non-reactive gas, such as argon, helium, or xenon, or (ii) a reactive gas such as nitrogen, ammonia, methane, or diborane. The mass flow rate of the sputtering gas is typically from about 1 to about 200 sccm, and the PVD chamber 36 is maintained at a pressure ranging from about 1 mTorr to about 500 mTorr. A plasma is generated from the process gas by electrically biasing the sputtering target using an RF or DC bias, and electrically grounding the support or the chamber walls in the PVD chamber. The sputtering target is bombarded by energetic plasma ions causing sputtered material to be removed from the target and deposited on the substrate 20. Preferably, the PVD process stage is performed for a sufficient time to deposit the sputtered layer to a thickness of at least about 1000 Å, and more preferably at from about 1000 to about 5000 Å.

Although exemplary processes are described in relation to deposition of aluminum, the process of the present invention can also be performed to uniformly fill holes with other conductive materials, including for example, the silicides of tungsten, titanium, tantalum, molybdenum, and mixtures thereof; other metals, such as for example, copper or chromium; and semiconductor materials, such as for example, silicon or polysilicon. The present process can also be used to deposit combinations of different materials including, for example, aluminum, copper, silicon, titanium, palladium, hafnium, boron, tungsten, tantalum, or mixtures thereof. Suitable CVD deposition gases for many of these materials include volatile metal alkyl or metal carbonyl precursor gases. For example, chromium can be deposited from chromium carbonyl, cadmium from dimethyl cadmium, and copper from copper carbonyl. Copper can also be deposited using a volatile copper coordination complex such as bis-(1, 1, 1, 5, 5, 5, hexafluoro-2, 4-pentanedionate) copper (2), $Cu(Hfa)_2$, $CuCl_2$, and $Cu(C_5H_7O_2)_2$. Thus, the present invention should not be limited to a particular process sequence, or to deposition of the exemplary materials described herein.

The following example demonstrates the effectiveness of the process of the present invention. However, the process and apparatus of the present invention can be used in other applications, and should not be restricted to the illustrative examples provided herein.

In these examples, a single-wafer "ENDURA" multi-chamber apparatus, commercially available from Applied Materials, Santa Clara, California, was used to perform the present process, as shown in FIGS. 2a and 2b. Silicon substrates 20 having a thickness of about 0.73 mm and a diameter of about 200 mm were used in these examples. The substrates had an insulator layer 24 of silicon dioxide having a thickness of about 3000 Å with vias 22 having diameters of 0.35 to 0.8 as deposited on the substrate using conventional CVD techniques. Each of the substrates 20 were loaded using a mechanical arm into the process zone 95 of the deposition chamber 40, from a load lock area (not shown) in which nitrogen was flowed at a pressure of 7 Torr. The substrate 20 was placed on a resistively heated support 65 in the deposition chamber 40.

In the first seeding stage, the substrate 20 was heated at a constant ramp rate of about 9° C./min, from ambient temperature to a setpoint temperature of 260° C. During the time the substrate 20 was at nucleation temperatures $T_s$ within the range of temperatures $\Delta T_s$ of 220 to 250° C., a short burst of dimethyl aluminum hydride (DMAH) seeding gas was flowed into the deposition chamber 40 via the gas distributor 55 at a flow rate of 400 sccm, by bubbling hydrogen carrier gas at a flow rate of 100 sccm through a bubbler containing liquid DMAH. The pressure in the process zone 95 was variable. The flow of seeding gas is terminated after the seeding gas was introduced into the process zone for a sufficient time to form a continuous aluminum-containing seeding layer 30 having a thickness of about 300 Å on the substrate 20.

Thereafter, a temperature stabilization stage was performed after the initial seeding stage and before the deposition stage, to stabilize the temperature of the substrate 20 at the deposition temperatures $T_d$. In this step, argon and hydrogen were introduced into the process zone and the pressure in chamber 40 was established by controlling the opening size of a throttle valve on the exhaust system. The substrate 20 was continuously heated from the nucleation temperatures to the deposition temperatures of about 260° C., and typically equilibrated within 60 seconds at a temperature of about 5° C. to 20° C. lower than the temperature of the support 65.

After the substrate 20 equilibrated at the deposition temperatures of 260° C., DMAH deposition gas comprising dimethyl aluminum hydride was introduced into the chamber 40 at a flow rate of about 400 sccm. The deposition gas was flowed into the chamber for about 15 seconds to grow an aluminum oriented crystal growth layer 32 having a thickness of about 1000 Å on the seeding layer 30.

Thereafter, the substrate 20 was transferred from the CVD chamber 40 to the PVD chamber 36, and a sputtering process was performed to sputter material onto the substrate 20. In the sputtering stage, an aluminum-containing sputtering target positioned above the substrate 20 was sputtered to deposit aluminum on the oriented crystal growth layer.

Argon was introduced into the chamber at a flow rate of 15 sccm through the gas distributor, and the chamber was maintained at a pressure of about 0.1 Torr. A power of 6000 watts was applied to the sputtering target to generate a plasma from the argon in the chamber 40. The argon plasma sputtered the aluminum target to deposit aluminum on the substrate 20 for about 30 seconds, to deposit an aluminum-containing layer having a thickness of about 5000 Å.

Figure 5A:
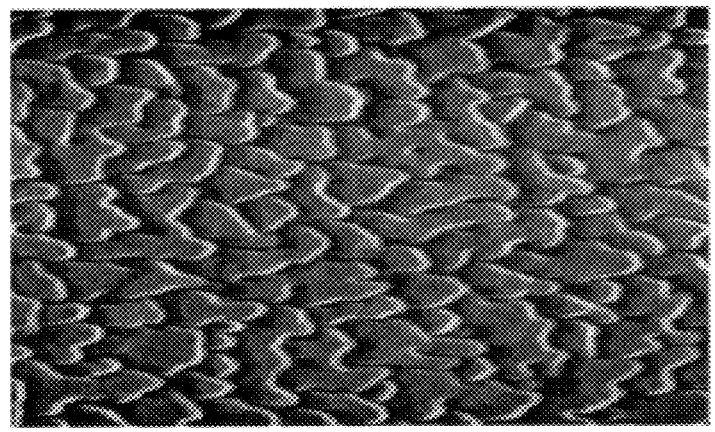
FIG. 5a and 5b are color drawings prepared from data obtained with a scanning electron microscope of the surface of (i) a thin granular layer of material deposited by a conventional process, and (ii) a substantially continuous, non-granular, uniformly wetting, seeding layer deposited by the present process, respectively.
Figure 5B:
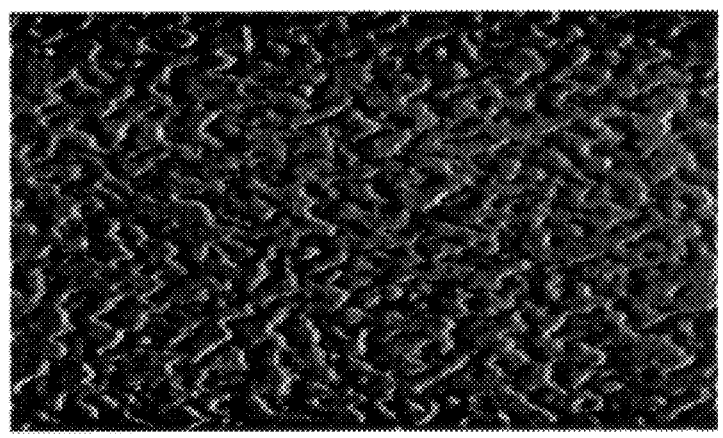

Several substrates were processed as described above. These substrates were studied using various techniques as described below. FIG. 5a and 5b show color drawings of the surface of (i) a thin layer of conductive material deposited by a conventional process, and (ii) a seeding layer 30 deposited by the present process. FIG. 5a reveals that conventional processes deposit a granular layer of relatively large sized crystals that form separated islands with high wetting angles. The individual crystals or "grains" of the conventional layer have diameters of at least about 1000 Å, and more typically from about 2000 to 6000 Å. The crystals formed discontinuous islands having apexes at the center of the grains, and low regions at the grain boundaries. In contrast, FIG. 5b shows deposition of a thin, substantially continuous seeding layer 30 that is absent granular nodules. The diameters of the fine crystallites range from about 100 to 500 Å. Also, it is seen that the seeding layer 30 substantially uniformly and continuously covers or "wets" the surface of the substrate 20.

Figure 6A:
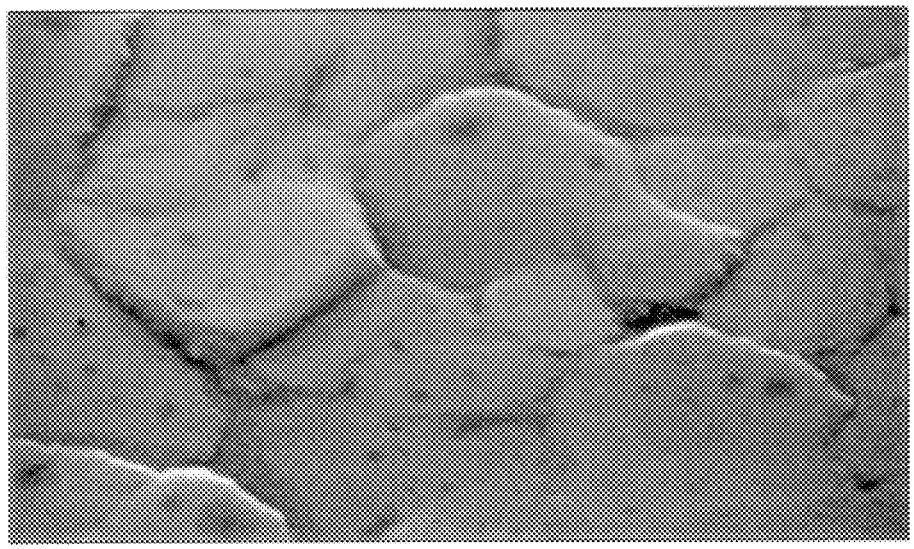
FIG. 6a and 6b are color drawings prepared from data obtained with a scanning electron microscope of the surface of (i) a deposition layer grown on a granular layer of material deposited using a conventional process, and (ii) an oriented crystal growth deposition layer grown on a seeding layer by the present process, respectively.
Figure 6B:
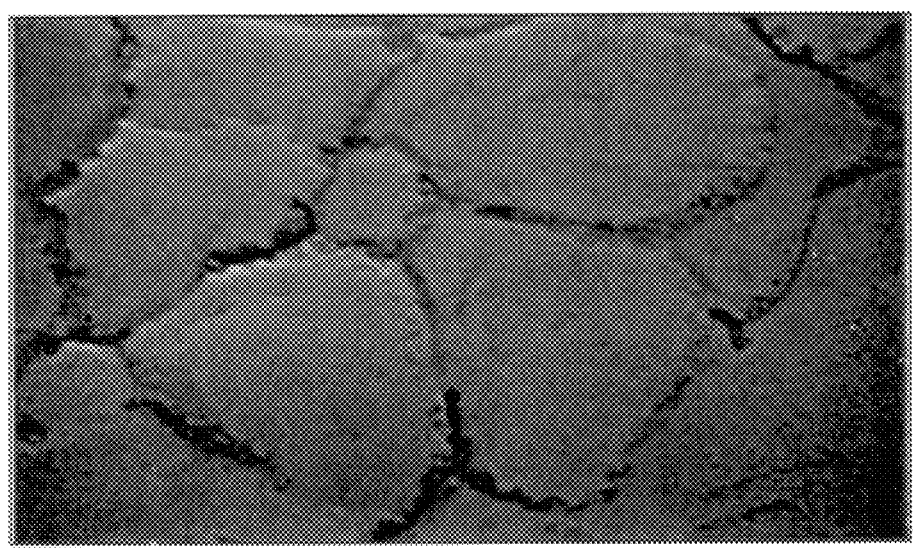

The color drawings of FIG. 6a and 6b are even more demonstrative of the unusual properties of the oriented crystal growth layers 32 that are grown on the seeding layers 30. FIG. 6a shows the surface of a layer of conductive material deposited using a conventional process, where it is seen that large crystal grains having diameters often exceeding 6000 Å form the deposited layer. The surface is rough and uneven with randomly oriented crystal cleavage planes clearly visible in the photograph. In contrast, FIG. 6b shows a planar oriented crystal growth layer 32 that is grown on a seeding layer 30 deposited by the present process. This color drawing shows a smooth, planar surface, that is substantially absent large granular nodules, and having crystals with large diameters that are substantially equivalent to the diameters of layer crystals formed in the underlying seeding layer.

The surface planarity of the oriented crystal growth layer 32 was determined by measuring their surface reflectivity. Conductive metal layers, for example, aluminum layers provide a highly reflective crystals that are aligned to one another, and have a substantially planar seam of light on the reflective surface of the deposited layer, and the intensity of light scattered by the reflective surface is measured by an optical sensor, such as a photoelectric transducer. The measured intensity of scattered light is compared to the intensity of light scattered from a monocrystalline silicon wafer to derive a relative percent number that provides a proportional measure of the reflectivity and planarity of the surface of the deposited layer.

Taking the intensity of the light beam scattered by silicon wafers to be about 100%, conventional deposition processes typically deposit metal layers having uneven surfaces that result in a scattered light reflectivity of about 140 to 200%. In the present examples, the deposited aluminum layers 32 provided highly reflective surfaces that reflected the beam of light projected from an optical source of light. The reflectivity measurements were dependent upon the thickness of the deposited layer, and the present reflectivity measurements were obtained on relatively thick deposited layers 32 having thicknesses in excess of 3000 Å. In the present method, reflectivity values of at least about 190% as compared to the reflectivity of a monocrystalline silicon wafer, and more typically at least about 210%, were obtained from the surface of the deposited metal-containing layers 32 demonstrating the highly planar surface of the layers.

FIGS. 7a–8b show X-ray diffraction rocking curves of the surface of aluminum layers deposited by conventional process, and by the process of the present invention. The rocking curves were obtained at 2 Θ angles corresponding to the aluminum crystallographic planes having <111> miller indices, using conventional X-ray diffractometer methods.

Figure 7A:
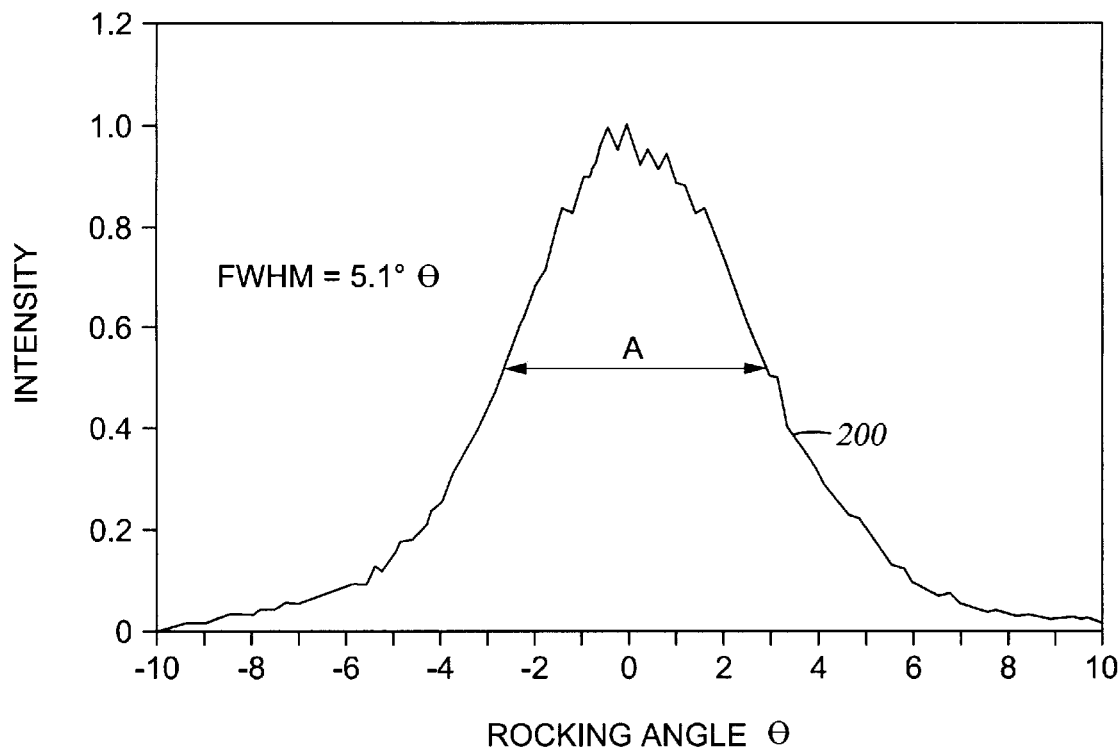
FIG. 7a and 7b are X-ray diffraction rocking curves of the <111> miller indices crystallographic plane of (i) an aluminum layer deposited using a conventional process, and (ii) an aluminum layer deposited by the present process, respectively.
Figure 7B:
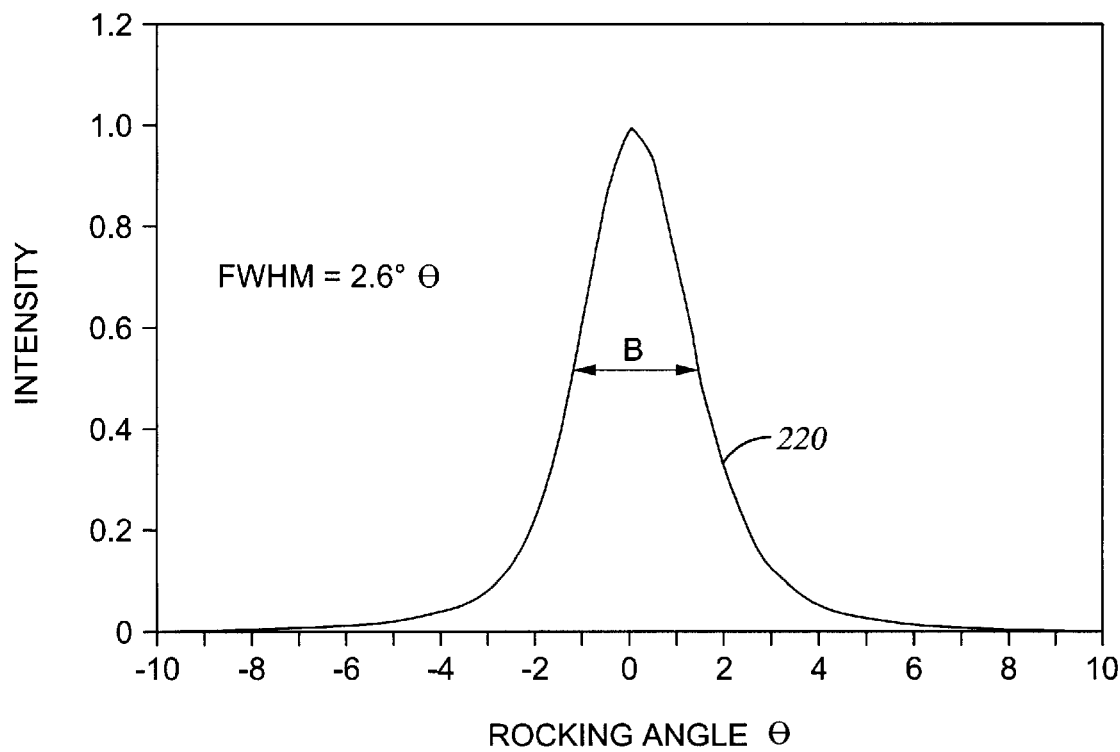

Line 200 of FIG. 7a shows a wide x-ray diffraction peak obtained from a conventional aluminum film, the large full width of the peak at half maxima, as shown by the line A, evidencing the more randomly oriented crystal grains deposited by the conventional deposition process. In contrast, the narrow peak of the x-ray diffraction line 210 of FIG. 7b and the corresponding small width at half maxima line B evidences the highly oriented crystal grains formed in the present process. Preferably, the full width at half maximum of the <111> miller indices of the x-ray diffraction peak of the present films are less than about 3° θ, and more preferably, less than about 4° θ.

Figure 8A:
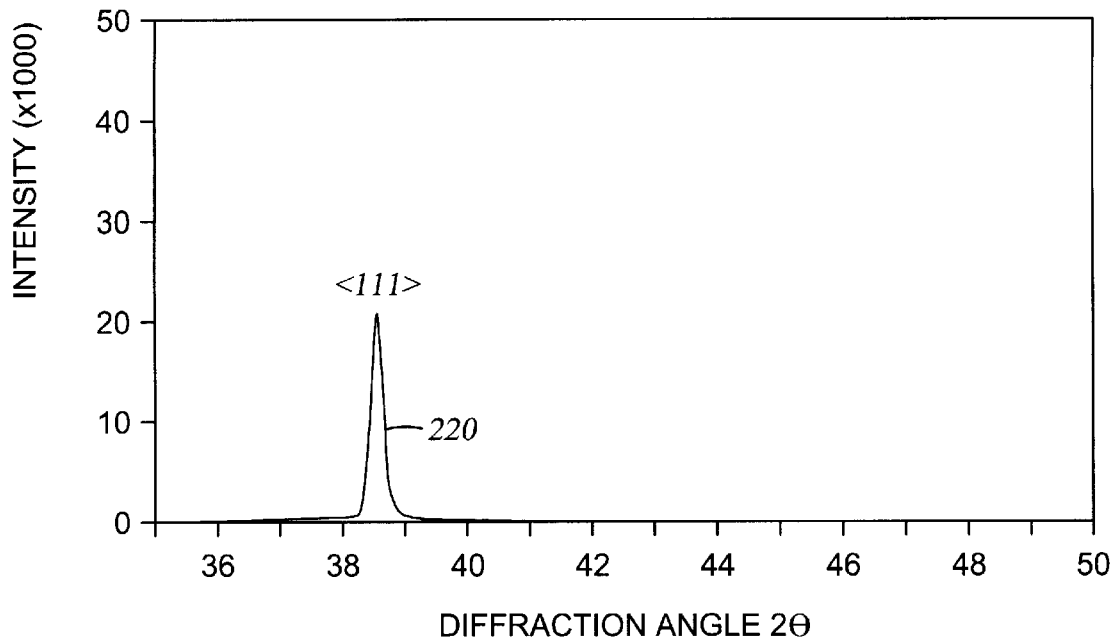
FIG. 8a and 8b are X-ray diffraction curves of the <111> and <200> miller indices crystallographic plane of (i) an aluminum layer deposited using a conventional process, and (ii) an aluminum layer deposited by the present process, respectively.
Figure 8B:
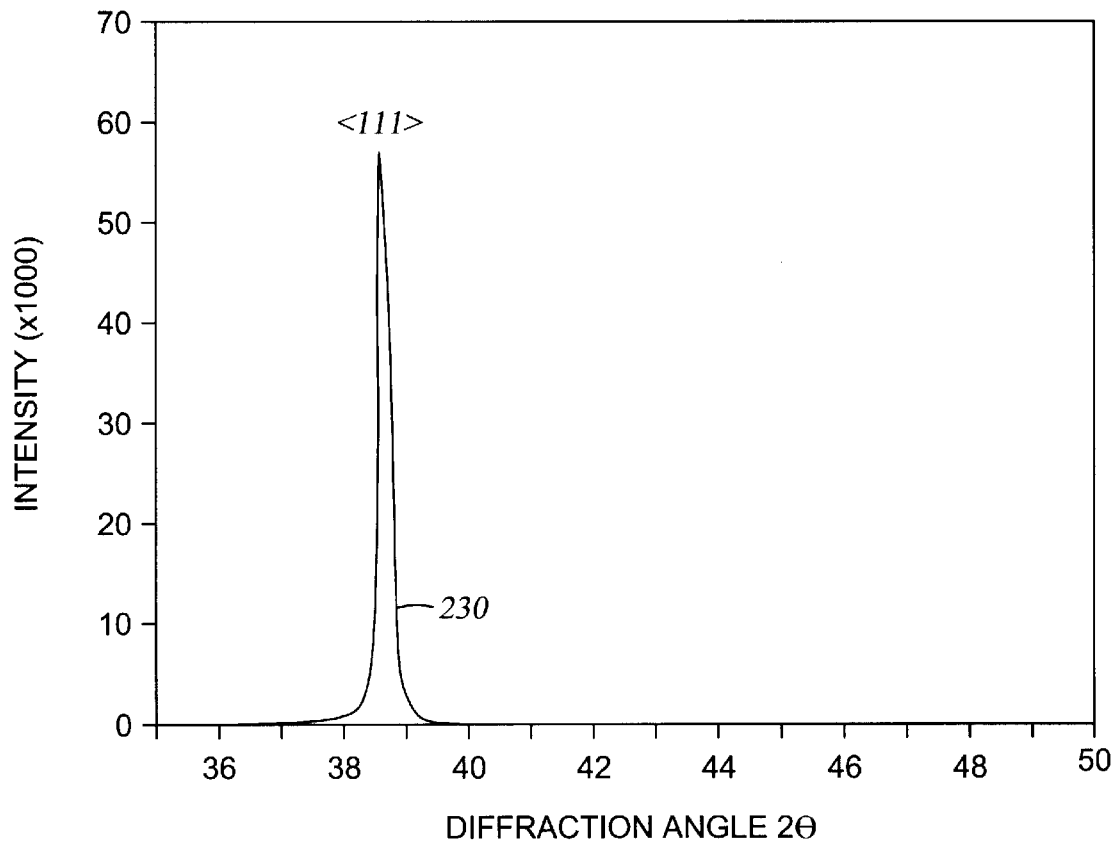

Referring to FIGS. 8a and 8b, the intensity or height of the two peaks of the lines 220 and 230 provide a measure of the amount or number of crystals having an orientation corresponding to the <111> crystallographic plane. The height of the line 220 in FIG. 8a, demonstrates a relatively low proportion of oriented crystallites in the conventionally deposited aluminum layer. In contrast, the large height of the line 230 in FIG. 8b, demonstrates the relatively large proportion of oriented crystallites formed in the oriented crystal growth layers 32 deposited by the present process. In fact, the height of the line 230 is typically at least 1.5 times, and more typically at least 4 times, the height of the line 220. This indicates that the deposition process of the present invention provides at least 1.5 to 4 times more crystallites oriented in the <111> miller indices crystallographic plane, than provided by a conventional process.

FIG. 9 shows a comparison of the surface reflectivity at different thickness of (i) a conventional layer deposited on the substrate as shown by the line 250, and (ii) seeding and oriented crystal growth layers 30, 32 formed by the present invention, as shown by the line 260. Typically, the reflectivity and planarity of the deposited layers decreases for increasing thickness of the deposited layers. However, at thicknesses above about 3000 Å, as shown by the portion 262, the reflectivity of layers deposited by conventional processes rapidly decreases for increasing thicknesses. In contrast, the reflectivity of layers 30, 32 deposited using the present process decrease more linearly and at a slower rate, even above thicknesses of 4000 Å. Thus, it is seen that the present process not only increases overall reflectivity, and consequently the planarity of thick layers of deposited material, but also reduces the rate of decrease of reflectivity as the thickness of deposited material is increased to higher levels. This provides a larger processing window for deposition of material on the substrate. The oriented crystal growth layer 32 forms a substantially smooth and planar top surface at deposit thickness greater than about 3000 Å allowing deposition of thick planar layers on the substrate.

FIGS. 10a and 10b show secondary ion mass spectroscopic analysis of (i) a conventional aluminum layer, and (ii) an aluminum layer deposited by the present process. It is seen that the carbon content of the conventional film, as shown by line 300 in FIG. 10a, is much higher than the surface carbon content of the film deposited by the present invention, as shown by line 302 in FIG. 10b. The present films have higher aluminum to carbon content in their interfacial surface layers, which are believed to result in more oriented and larger crystal grains. Also, the lower carbon content produces lower resistivity in the deposited layers.

The resistivity of the aluminum-containing layer formed on the substrate was measured using a four-point probe method. It is was determined that the resistivity of the deposited aluminum layers 30, 32 was typically less than about 3.3 $\mu\Omega$ cm, and more typically from about 2.8 to about 3.1 $\mu\Omega$ cm. This is considerably lower than the resistivity of aluminum layers deposited by conventional methods, which are typically from about 3.2 to about 3.8 $\mu\Omega$ cm. Also, the uniformity of resistivity of the deposited aluminum layers 30, 32 was typically less than about 5%, and more typically from about 4 to about 5%; which is considerably better than the uniformity of resistivity of conventional aluminum layers which are typically from about 6 to 7%.

The above-described apparatus and processes have several significant advantages over conventional processes. First, the described process allows deposition of a substantially continuous, planar, highly reflective, electrically conductive layer on a substrate. Furthermore, the process forms a highly oriented crystallographic layer that reduces electromigratory effects consequently increasing the current density handling capability of the layer. Also, the combined CVD and sputtering processes deposit material uniformly into contact holes and vias, at faster deposition rates than conventional processes.

The present invention has been described in considerable detail with reference to certain preferred versions thereof. However, other versions are possible. For example, the present invention can be used to deposit many different materials on the substrate, and is not limited to processing of semiconductor substrates. Therefore the spirit and scope of the appended claims should not be limited to the description of the preferred versions contained herein.

What is claimed is:

1. A chemical vapor deposition process for depositing a substantially planar, highly reflective layer on a substrate, the process comprising:
   (a) placing the substrate in a process zone;
   (b) in an initial seeding stage, (i) heating the substrate to an initial seeding temperature $T_s$ within a first lower range of temperatures $\Delta T_s$, and (ii) introducing seeding gas into the process zone to deposit a substantially continuous seeding layer on the substrate; and
   (c) in a subsequent oriented crystal growth stage, (i) maintaining the substrate at a deposition temperature $T_d$ within a second higher range of temperatures $\Delta T_D$, wherein the initial seeding temperature $T_s$ is from about 10° C. to about 30° C. lower than the deposition temperature $T_d$, and (ii) introducing deposition gas into the process zone to form an oriented crystal growth layer on the seeding layer.

2. The process of claim 1, wherein the seeding layer has a thickness from about 10 Å to about 500 Å.

3. The process of claim 1, wherein the oriented crystal growth layer has a thickness from about 200Å to about 6000 Å.

4. The process of claim 1, wherein in the seeding stage, the first range of temperatures $\Delta T_s$ is from about 200° C. to about 300° C.

5. The process of claim 1, wherein in the seeding stage, the initial seeding temperature is less than about 250° C.

6. The process of claim 1, wherein in the oriented crystal growth stage, the second range of temperatures $\Delta T_D$ is from about 200° C. to about 420° C.

7. The process of claim 1, wherein the oriented crystal growth layer formed on the seeding layer reflects at least 90% more light than a monocrystalline silicon wafer.

8. The process of claim 1, further comprising a stabilization stage performed after the seeding stage and before the deposition stage, the stabilization stage comprising the step of introducing non-reactive process gas into the process zone while heating the substrate from the initial seeding temperature $T_s$ to the deposition temperature $T_d$.

9. The process of claim 1, wherein the seeding and deposition gases comprise metal-containing gases.

10. The process of claim 1, wherein the seeding and deposition gases are selected from the group consisting of aluminum alkyls, aluminum alkyl halides, dimethyl aluminum hydride, tri-isobutyl aluminum, trimethylamine alane, dimethylethylamine alane, and mixtures thereof.

11. The process of claim 10, wherein the seeding gas comprises dimethyl aluminum hydride transported by a carrier gas.

12. The process of claim 11, wherein the carrier gas comprises hydrogen, argon, or helium.

13. The process of claim 1, wherein the seeding and oriented crystal growth stages are performed for sufficient periods of time, that the ratio of the thickness of the seeding layer to the thickness of the oriented crystal growth layer is from about 1:10 to about 1:300.

14. The process of claim 1, wherein the seeding stage is performed for a sufficient time to deposit a substantially continuous, planar, seeding layer in a thickness of less than about 300 Å.

15. The process of claim 1, wherein the seeding stage is performed for about 2 to about 20 seconds.

16. The process of claim 1, wherein the oriented crystal growth stage is performed for about 4 to about 50 seconds.

17. The process of claim 1, wherein the oriented crystal growth layer comprises <111> miller indices crystallographic planes having an x-ray diffraction peak with a full width at half maximum of less than about 3° θ.

18. The process of claim 1, wherein the process comprises the step of etching holes in the substrate, and wherein the seeding layer and the oriented crystal growth layer are formed in the holes in the substrate.

19. A substrate prepared by the process of claim 18.

20. A substrate prepared by the process of claim 1, wherein the substrate comprises a substantially planar, highly reflective, aluminum-containing layer characterized by:

(a) <111> miller indices crystallographic planes that exhibit an x-ray diffraction peak with a full width at half maximum of less than about 3° θ; and (b) a surface that reflects at least 90% more light than a monocrystalline silicon wafer.

21. A computer program product for controlling a process chamber for depositing a substantially planar, highly reflective, layer on a substrate, comprising:

(a) a computer usable medium having computer readable program code embodied therein, the computer readable program code comprising:

(b) heater control code for controlling a heater in (i) a seeding stage, wherein the substrate is maintained at an initial seeding temperature $T_s$ within a first range of temperatures $\Delta T_s$ and (ii) a deposition stage, wherein the substrate is maintained at a deposition temperature $T_d$ within a second range of temperatures $\Delta T_D$, wherein the initial seeding temperature $T_s$ is from about 10° C. to about 30° C. lower than the deposition temperature $T_d$; and (c) process gas control code for controlling introduction of one or more process gases (i) in a seeding mode, to control introduction of seeding gas into the process zone during the seeding stage to deposit a substantially continuous seeding layer on the substrate, and (ii) in a deposition mode, to control introduction of deposition gas into the process zone during the deposition stage to form a deposition layer on the seeding layer.

22. The computer program product of claim 21, wherein in the seeding stage, the first range of temperatures $\Delta T_s$ is from about 200° C. to about 300° C.

23. The computer program product of claim 21, wherein in the deposition stage, the second range of temperatures $\Delta T_D$ is from about 200° C. to about 420° C.

24. The computer program product of claim 21, wherein the process gas control code further controls the one or more process gases in a stabilization stage after the seeding stage and before the deposition stage, in which non-reactive process gas is introduced into the process zone, while heating the substrate from the initial seeding temperature $T_s$ to the deposition temperature $T_d$.

25. The computer program product of claim 21, wherein in the seeding stage, the process gas control code further controls the one or more process gases to introduce a metal-containing seeding gas into the process zone for about 2 to about 20 seconds.

26. The computer program product of claim 21, wherein in the deposition stage, the process gas control code further controls the one or more process gases to introduce a metal-containing deposition gas into the process zone for about 4 to about 50 seconds.

27. The computer readable program product of claim 21, wherein in the seeding and deposition stages, the process gas control code further controls the one or more process gases to introduce into the process zone, a gas selected from the group consisting of aluminum alkyls, aluminum alkyl halides, dimethyl aluminum hydride, tri-isobutyl aluminum, trimethylamine alane, dimethylethylamine alane, and mixtures thereof.

28. A computer readable program product for controlling a process chamber which deposits a substantially planar, highly reflective, metal-containing layer on a substrate, the computer readable program product comprising:

nucleation program code for (i) controlling a heater that heats the substrate to an initial seeding temperature $T_S$ within a first range of temperatures $\Delta T_S$, and (ii) controlling the introduction of one or more process gases to introduce a metal-containing seeding gas into the process chamber to deposit a substantially continuous seeding layer on; and oriented crystal growth program code for (i) controlling the heater to maintain the substrate at a deposition temperature $T_d$ within a second range of temperatures $\Delta T_D$, wherein the initial seeding temperature $T_S$ is from about 10° C. to about 30° C. lower than the deposition temperature $T_d$, and (ii) controlling the introduction of the one or more process gases to introduce a metal-containing deposition gas into the process zone to grow an oriented crystal growth layer on the seeding layer.

29. The computer readable program product of claim 28, wherein the second range of temperatures $\Delta T_s$ is from about 200° C. to about 300° C.

30. The computer readable program product of claim 28, wherein the second range of temperatures $\Delta T_D$ is from about 200° C. to about 420° C.

31. The computer readable program product of claim 28, wherein the seeding program code controls the one or more process gases to introduce the metal-containing seeding gas into the process zone for about 2 to about 20 seconds.

32. The computer readable program product of claim 28, wherein the deposition program code controls the one or more process gases to introduce the metal-containing deposition gas into the process zone for about 4 to about 50 seconds.

* * * * *